(12) United States Patent
Chen et al.

(10) Patent No.: US 11,950,380 B2
(45) Date of Patent: Apr. 2, 2024

(54) PORTABLE ELECTRONIC DEVICE

(71) Applicant: ASUSTEK COMPUTER INC., Taipei (TW)

(72) Inventors: Wei-En Chen, Taipei (TW); Pei-Chiang Lin, Taipei (TW)

(73) Assignee: ASUSTEK COMPUTER INC., Taipei (TW)

( * ) Notice: Subject to any disclaimer, the term of this patent is extended or adjusted under 35 U.S.C. 154(b) by 0 days.

(21) Appl. No.: 17/898,625

(22) Filed: Aug. 30, 2022

(65) Prior Publication Data

US 2023/0225061 A1 Jul. 13, 2023

(30) Foreign Application Priority Data

Jan. 13, 2022 (TW) ................................. 111101404

(51) Int. Cl.
*H05K 5/02* (2006.01)
*H04M 1/02* (2006.01)

(52) U.S. Cl.
CPC .............. *H05K 5/02* (2013.01); *H04M 1/026* (2013.01)

(58) Field of Classification Search
CPC ........ H05K 5/02; H05K 5/0217; H04M 1/026
See application file for complete search history.

(56) References Cited

U.S. PATENT DOCUMENTS

| | | | | |
|---|---|---|---|---|
| 6,864,679 | B2 * | 3/2005 | Yokoji | H03K 17/97 324/207.25 |
| 7,462,787 | B1 * | 12/2008 | Kang | H01H 25/041 200/14 |
| 8,358,278 | B2 | 1/2013 | Lim et al. | |
| 2003/0117132 | A1 * | 6/2003 | Klinghult | G06F 3/033 324/207.25 |
| 2005/0264530 | A1 * | 12/2005 | Takatsuka | G06F 3/0338 345/160 |
| 2007/0037618 | A1 * | 2/2007 | Lee | H04M 1/0239 455/575.4 |
| 2008/0309637 | A1 * | 12/2008 | Lim | G06F 1/1656 345/184 |
| 2012/0182101 | A1 * | 7/2012 | Yoshida | G06F 3/0202 335/205 |
| 2015/0248209 | A1 * | 9/2015 | Kim | G06F 3/03 345/173 |
| 2021/0241984 | A1 * | 8/2021 | Moon | H01H 13/88 |

FOREIGN PATENT DOCUMENTS

| | | |
|---|---|---|
| CN | 111095172 A | 5/2020 |
| CN | 106820519 B | 11/2020 |
| CN | 108605080 B | 6/2021 |
| TW | I354916 B | 12/2011 |

* cited by examiner

*Primary Examiner* — Sagar Shrestha

(74) *Attorney, Agent, or Firm* — Muncy, Geissler, Olds & Lowe, P.C.

(57) ABSTRACT

A portable electronic device is provided. The portable electronic device includes a main body and an accessory. The main body includes a display region, a non-display region, and a plurality of magnetic sensors. The magnetic sensors are disposed on the non-display region along a path. The accessory is movably disposed on the non-display region and includes a magnetic element. When the accessory moves on the non-display region, the accessory drives the magnetic element moving along the path.

6 Claims, 5 Drawing Sheets

PORTABLE ELECTRONIC DEVICE

CROSS-REFERENCE TO RELATED APPLICATION

This application claims the priority benefit of Taiwan application serial No. 111101404, filed on Jan. 13, 2022. The entirety of the above-mentioned patent application is hereby incorporated by reference herein and made a part of the specification.

BACKGROUND OF THE INVENTION

Field of the Invention

The disclosure relates to a portable electronic device and, more particularly, a portable electronic device used with an accessory.

Description of the Related Art

A traditional portable electronic device uses a touch panel or key as an input interface. However, the operation mode of these input interfaces is monotonous and cannot provide intuitive operations.

BRIEF SUMMARY OF THE INVENTION

A portable electronic device is provided. The portable electronic device includes a main body and an accessory. The main body includes a display region, a non-display region, and a plurality of magnetic sensors. The magnetic sensors are disposed on the non-display region along a path. The accessory is movably disposed on the non-display region and includes a magnetic element. When the accessory moves on the non-display region, the accessory drives the magnetic element moving along the path.

Through the portable electronic device provided in this disclosure, a user can use the accessory to drive the magnetic element to change its position along a path, thereby controlling the operation of the portable electronic device. This operation mode is different from the traditional touch panels or keys, and is capable of providing the user with different operation experiences. In addition, in the disclosure, magnetic elements are used for control, and it is unnecessary to add physical keys to the main body of the portable electronic device, which is beneficial to improving the integrity of the overall appearance of the portable electronic device.

DETAILED DESCRIPTION OF THE EMBODIMENTS

The following further describes the specific implementations of the present disclosure in detail with reference to the schematic diagrams. The features and advantages of the disclosure are described more clearly according to the following description and claims. It should be noted that all of the drawings use very simplified forms and imprecise proportions, only being used for assisting in conveniently and clearly explaining the objective of the embodiments of the disclosure.

Figure 1:
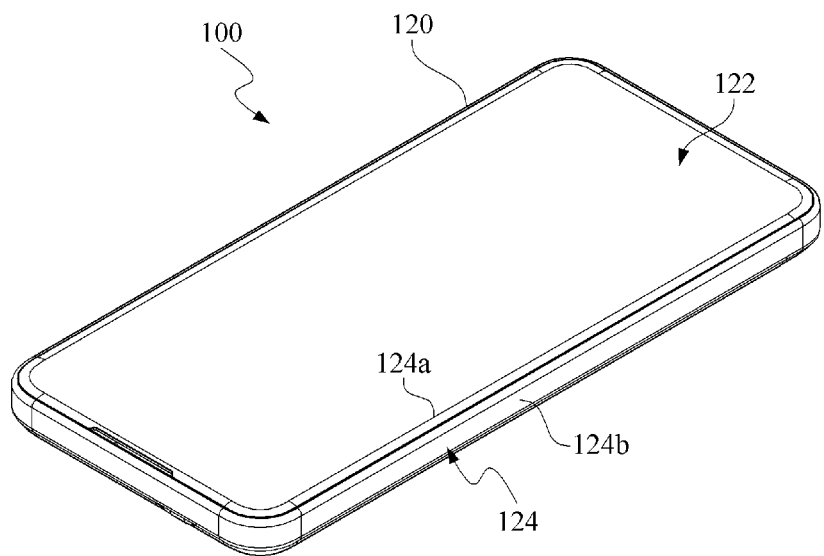
FIG. 1 is a three-dimensional front view of a portable electronic device according to an embodiment of the disclosure.
Figure 2:
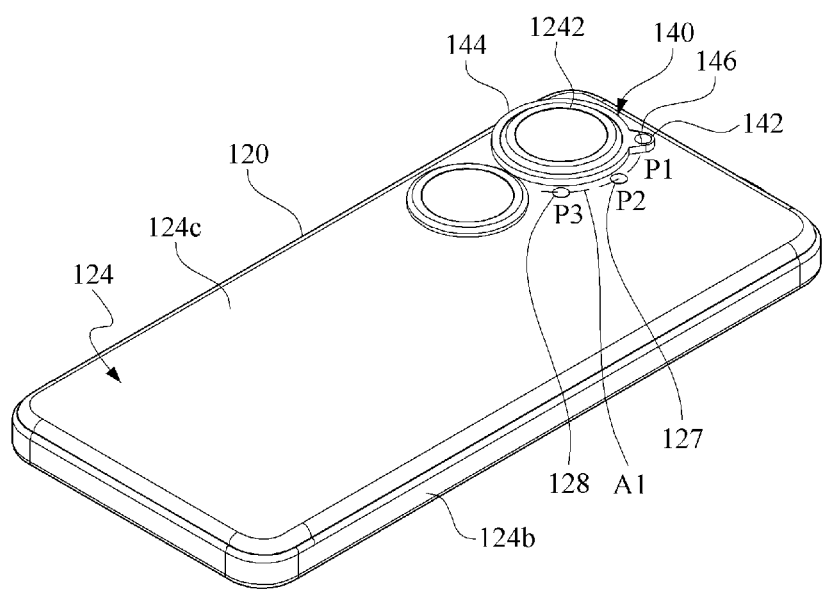
FIG. 2 is a three-dimensional rear view of a portable electronic device according to an embodiment of the disclosure.

Referring to FIG. 1 and FIG. 2, a portable electronic device 100 in the present disclosure has a main body 120 and an accessory 140. The main body 120 has a display region 122, a non-display region 124 and a plurality of magnetic sensors (three magnetic sensors 126, 127, 128 are taken as examples in the figure). In an embodiment, the portable electronic device 100 is a mobile phone, tablet computer, rocker, controller, or the like, which is not limited in the present disclosure.

The display region 122 is located on a front surface of the main body 120. The non-display region 124 is a region of a surface of the main body 120 other than the display region 122, which includes a front portion 124a (located at an edge of the front surface of the main body 120), a side portion 124b, and a rear portion 124c.

In an embodiment, the display region 122 is located on the front surface of the main body 120. However, the disclosure is not limited thereto. In other embodiments, the display region 122 extends from the front surface of the main body 120 to the side surface of the main body 120 or both the front surface and rear surface of the main body 120 have the display region 122.

In an embodiment, the magnetic sensors 126, 127 and 128 are disposed at different positions P1, P2 and P3 of the non-display region 124, and are disposed along an arc path A1 in the non-display region 124. The magnetic sensors 126, 127, 128 correspond to different trigger events.

The accessory 140 is disposed on the non-display region 124 and includes a magnetic element 142. The accessory 140 drives the magnetic element 142 to move along the foregoing arc path A1 on which the magnetic sensors 126, 127, 128 are disposed.

In one embodiment, the accessory 140 is inseparably disposed in the non-display region 124 to avoid detachment and missing of the accessory 140. However, it is not limited thereto. In other embodiments, the accessory 140 is disposed on the non-display region 124 in a detachable manner, and the user installs or removes the accessory 140 as needed.

In an embodiment, as shown in FIG. 2, the rear portion 124c of the non-display region 124 has at least one annular protrusion part 1242 (two annular protrusion parts are shown in the figure, only one of which is indicated) to mount the accessory 140.

The accessory 140 includes a surrounding part 144 and a swing arm 146. The surrounding part 144 is rotatably disposed around the annular protrusion part 1242. The swing arm 146 extends outward from the surrounding part 144. The magnetic element 142 is disposed on the swing arm 146. The annular protrusion part 1242 accommodates lenses, speakers or other elements requiring a larger set-up space.

The magnetic sensors 126, 127, 128 surround the annular protrusion part 1242, and are arranged along an arc path A1 on the rear portion 124c of the non-display region 124. Since the accessory 140 drives the magnetic element 142 to move with the center of the annular protrusion part 1242 as a rotation axis, the center of the arc path A1 falls at the center of the annular protrusion part 1242 to ensure that the magnetic element 142 is aligned with the respective magnetic sensors 126, 127, 128 disposed along the arc path A1.

In an embodiment, the number of the magnetic sensors 126, 127, 128 is three and the magnetic sensors are equidistantly disposed on the non-display region 124 along the arc path A1. However, it is not limited thereto. The number and spacing of the magnetic sensors 126, 127, 128 are adjustable according to actual needs.

Figure 3:
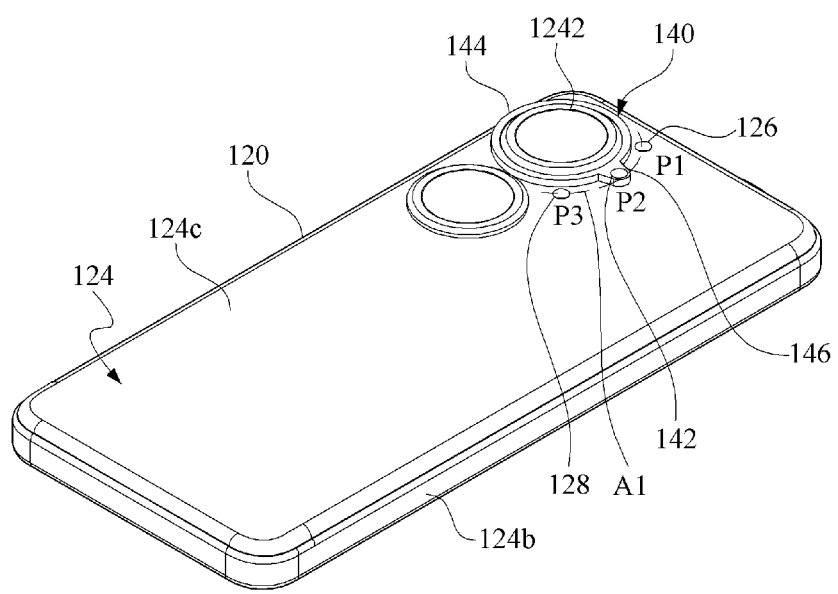
FIG. 3 is a three-dimensional schematic diagram showing that an accessory of a portable electronic device drives a magnetic element to move along a path according to an embodiment of the disclosure.

Referring to FIG. 3, the user changes the position of the magnetic element 142 by shifting the swing arm 146 to initiate different trigger events. When the user shifts the swing arm 146 to move the magnetic element 142 from a position P1 to a position P2, the magnetic sensor 127 at the position P2 detects the magnetic element 142 and generates a signal to notify the portable electronic device to execute a trigger event corresponding to the magnetic sensor 127. When the user shifts the swing arm 146 to move the magnetic element 142 along the arc path A1 further to a position P3, the magnetic sensor 128 at the position P3 detects the magnetic element 142 and generates a signal to notify the portable electronic device to execute the trigger event corresponding to the magnetic sensor 128.

The trigger event is launching a specific application, executing a specific function of an application, or the like. For example, the trigger event is starting a camera program or executing a filter function of the camera program; or the trigger event is starting a playback program, executing a volume adjustment function of the playback program, or the like.

In this embodiment, a single accessory 140 is provided in the non-display region 124 for operation. However, it is not limited thereto. In an embodiment, as shown in FIG. 2, the magnetic sensors 126, 127, 128 are provided around the two annular protrusion parts 1242 located on the rear portion 124c to provide more diverse operational options. The portable electronic device 100 is provided with two accessories 140 to match the two annular protrusion parts 1242 with the accessories 140, or is operated with a single detachable accessory 140 with the two annular protrusion parts 1242.

Figure 4:
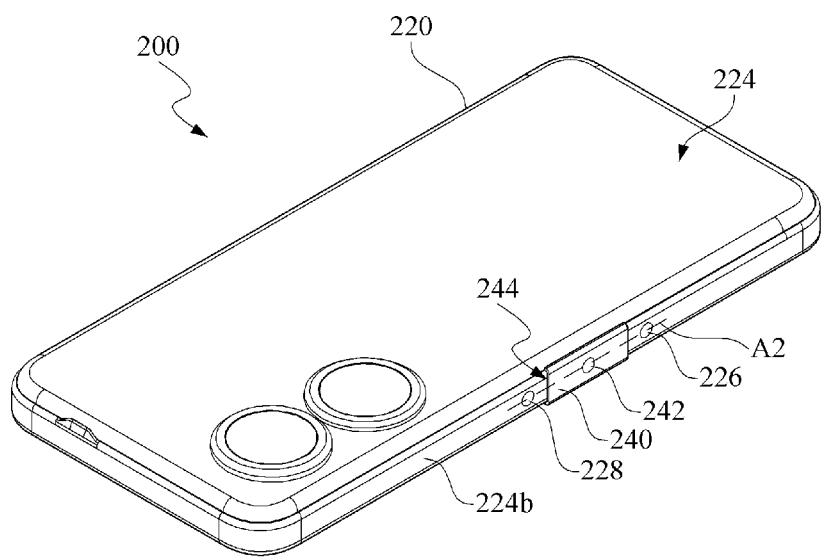
FIG. 4 is a three-dimensional schematic diagram of a portable electronic device according to another embodiment of the disclosure.
Figure 5:
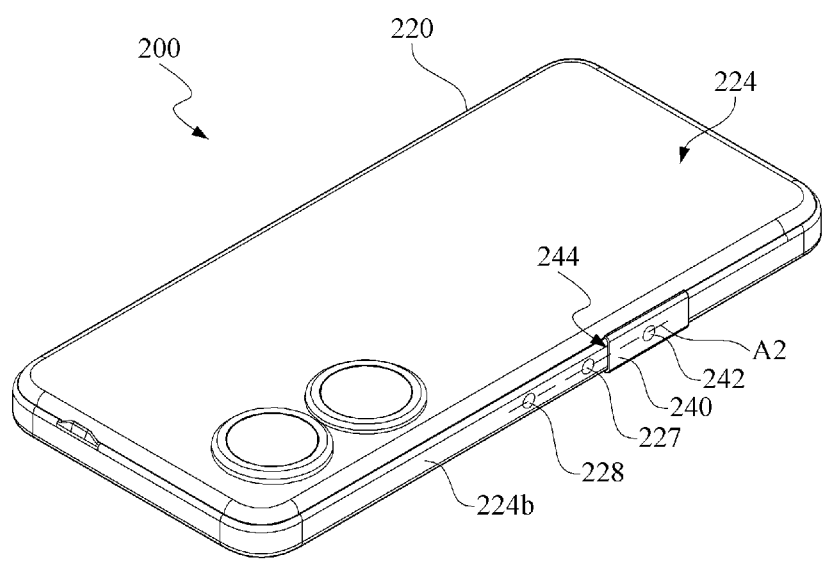
FIG. 5 is a three-dimensional schematic diagram showing that an accessory of a portable electronic device drives a magnetic element to move along a path according to another embodiment of the disclosure.

Referring to FIG. 4 and FIG. 5, the magnetic sensors 126, 127, 128 are disposed along an arc path A1 on the rear portion 124c of the non-display region 124. While magnetic sensors 226, 227, 228 of a portable electronic device 200 in this embodiment are disposed along a straight-line path A2 on a side portion 224b of a non-display region 224 of a main body 220. In accordance with positions of the magnetic sensors 226, 227, 228, an accessory 240 in this embodiment is movably disposed on the side portion 224b of a non-display region 224 to drive a magnetic element 242 to move along the straight-line path A2.

In an embodiment, as shown in FIG. 4, the accessory 240 in this embodiment has a groove 244 on a side facing the non-display region 224, and the groove 244 is shaped to match the side portion 224b of the non-display region 224, so that the accessory 240 slides along the side portion 224b of the non-display region 224. Referring to FIG. 5, the user can move the accessory 240 along the side portion 224b of the non-display region 224 to change the position of the magnetic element 242 so that the magnetic element 242 is aligned with different magnetic sensors 226, 227, 228 to initiate different trigger events.

Through the portable electronic devices 100, 200 provided in this disclosure, the user can use the accessories 140, 240 to drive the magnetic elements 142, 242 to change their positions along paths, such as the arc path A1 or the straight-line path A2, to initiate different trigger events, thereby controlling the operation of the portable electronic device. This operation mode is different from the traditional touch panels or keys, and is capable of providing the user with different operation experiences. In addition, in the disclosure, magnetic elements 142, 242 are used for control, and it is unnecessary to add physical keys to the main bodies 120, 220 of the portable electronic device 100, 200, which is beneficial to improving the integrity of the overall appearance of the portable electronic devices 100, 200.

The above is merely preferred embodiments of the disclosure, and does not constitute any limitation on the disclosure. Any form of equivalent replacements or modifications to the technical means and technical content disclosed in the disclosure made by a person skilled in the art without departing from the scope of the technical means of the disclosure still fall within the content of the technical means of the disclosure and the protection scope of the disclosure.

What is claimed is:

1. A portable electronic device, comprising:
   a main body, comprising a display region, a non-display region, and a plurality of magnetic sensors, wherein the magnetic sensors are disposed on the non-display region along a path; and
   an accessory, movably disposed on the non-display region and comprising a magnetic element;
   wherein when the accessory moves on the non-display region, the accessory drives the magnetic element to move along the path,
   wherein the path is an arc path,
   wherein the non-display region comprises an annular protrusion part, the arc path surrounds the annular protrusion part, the accessory comprises a surrounding part and a swing arm, the surrounding part is rotatably fixed to the annular protrusion part, the swing arm extends outward from the surrounding part, and the magnetic element is disposed on the swing arm,
   wherein the non-display region comprises a rear portion, and the annular protrusion part is protruded from the rear portion, and
   wherein the display region is on a first side of the electronic device, the rear portion is on a second side of the electronic device, the second side is opposite from the first side.

2. The portable electronic device according to claim 1, wherein the accessory is disposed on the non-display region in a detachable manner.

3. The portable electronic device according to claim 1, wherein the magnetic sensors are equidistantly disposed on the non-display region along the path.

4. The portable electronic device according to claim 1, wherein the annular protrusion part is configured to accommodate a lens.

5. The portable electronic device according to claim 1, wherein the magnetic sensors are disposed on the rear portion.

6. The portable electronic device according to claim 1, wherein the magnetic sensors correspond to different trigger events, respectively.

* * * * *